United States Patent
Mori et al.

(10) Patent No.: US 8,391,011 B2
(45) Date of Patent: Mar. 5, 2013

(54) COOLING DEVICE

(75) Inventors: Shogo Mori, Aichi-ken (JP); Eiji Kono, Aichi-ken (JP)

(73) Assignee: Kabushiki Kaisha Toyota Jidoshokki, Aichi-Ken (JP)

(*) Notice: Subject to any disclaimer, the term of this patent is extended or adjusted under 35 U.S.C. 154(b) by 164 days.

(21) Appl. No.: 13/070,088

(22) Filed: Mar. 23, 2011

(65) Prior Publication Data

US 2011/0235279 A1    Sep. 29, 2011

(30) Foreign Application Priority Data

Mar. 29, 2010  (JP) .................................. 2010-075175

(51) Int. Cl.
*H05K 7/20*      (2006.01)
*F28F 13/00*     (2006.01)

(52) U.S. Cl. ................... 361/717; 361/679.53; 361/699; 361/701; 361/702; 361/715; 257/706; 257/707; 257/712; 257/713; 257/714; 257/E23.101; 257/E23.103; 165/80.4; 165/80.5; 165/104.33; 29/832; 29/890.03; 29/890.039; 428/208; 428/209; 428/675; 428/677; 428/685

(58) Field of Classification Search ............ 361/679.46, 361/679.53, 699–712, 714–728; 165/80.2, 165/80.4, 80.5, 104.14, 104.16, 104.19, 104.22, 165/104.28, 104.33, 104.34, 185; 257/706–727, 257/E23.051, E23.101, E23.103, E23.109, 257/E23.113, E23.183, E23.186; 29/592.1, 29/740, 741, 759, 832, 890.03, 890.039, 29/831, 602.1; 62/3.3, 3.6, 244, 259.2, 228.1, 62/434; 428/208–213, 545, 667, 675, 677, 428/676, 681, 679, 685
See application file for complete search history.

(56) References Cited

U.S. PATENT DOCUMENTS

| 4,718,163 | A | * | 1/1988 | Berland et al. .................. 29/837 |
| 5,395,679 | A | * | 3/1995 | Myers et al. .................. 428/209 |
| 5,754,403 | A | * | 5/1998 | Ozmat et al. .................. 361/720 |
| 6,310,775 | B1 | * | 10/2001 | Nagatomo et al. ............ 361/707 |
| 6,485,816 | B2 | * | 11/2002 | Araki et al. .................. 428/210 |

(Continued)

FOREIGN PATENT DOCUMENTS

| EP | 1901350 | 3/2008 |
| EP | 1930943 | 6/2008 |

(Continued)

OTHER PUBLICATIONS

U.S. Appl. No. 13/069,933 to Shogo Mori, which was filed on Mar. 23, 2011.

(Continued)

*Primary Examiner* — Michail V Datskovskiy
(74) *Attorney, Agent, or Firm* — Greenblum & Bernstein, P.L.C.

(57) ABSTRACT

A cooling device includes a heat sink having a top plate, a bottom plate spaced from the top plate and fins between the top and bottom plates, a first metal member laminated to the side of the top plate that is opposite from the fins, and a first insulator laminated to the first metal member. The top plate, the bottom plate and the first metal member are each made of a clad metal that is composed of a base metal and a brazing metal, so that the fins are brazed to the top and bottom plates, the first metal member is brazed to the top plate, and the first insulator is brazed to the first metal member.

7 Claims, 2 Drawing Sheets

U.S. PATENT DOCUMENTS

| | | | |
|---|---|---|---|
| 7,019,975 B2 * | 3/2006 | Nagatomo et al. | 361/704 |
| 7,532,481 B2 * | 5/2009 | Nagase et al. | 361/739 |
| 7,755,185 B2 * | 7/2010 | Bayerer et al. | 257/714 |
| 7,948,758 B2 * | 5/2011 | Buhler et al. | 361/702 |
| 7,958,934 B2 * | 6/2011 | Nara et al. | 165/80.4 |
| 8,029,918 B2 * | 10/2011 | Hasegawa et al. | 428/675 |
| 8,030,760 B2 * | 10/2011 | Toh et al. | 257/712 |
| 8,064,198 B2 * | 11/2011 | Higashidani et al. | 361/679.53 |
| 8,102,652 B2 | 1/2012 | Toh et al. | |
| 8,164,909 B2 * | 4/2012 | Nagase et al. | 361/728 |
| 8,198,539 B2 | 6/2012 | Otoshi et al. | |
| 8,283,773 B2 * | 10/2012 | Mori et al. | 257/705 |
| 8,299,606 B2 * | 10/2012 | Mori et al. | 257/706 |
| 2004/0168447 A1 * | 9/2004 | Sugito et al. | 62/114 |
| 2008/0003451 A1 * | 1/2008 | Suzuki et al. | 428/654 |
| 2008/0128896 A1 | 6/2008 | Toh et al. | |
| 2008/0239671 A1 * | 10/2008 | Amano et al. | 361/699 |
| 2009/0086435 A1 | 4/2009 | Suzuki et al. | |
| 2009/0141451 A1 * | 6/2009 | Mori et al. | 361/699 |
| 2009/0147479 A1 * | 6/2009 | Mori et al. | 361/699 |
| 2009/0200065 A1 | 8/2009 | Otoshi et al. | |
| 2010/0002397 A1 | 1/2010 | Toh et al. | |
| 2010/0002399 A1 | 1/2010 | Mori et al. | |
| 2010/0193941 A1 * | 8/2010 | Mori et al. | 257/712 |
| 2010/0246139 A1 | 9/2010 | Suzuki et al. | |
| 2012/0113598 A1 | 5/2012 | Toh et al. | |
| 2012/0126390 A1 * | 5/2012 | Mori et al. | 257/706 |
| 2012/0175765 A1 | 7/2012 | Mori et al. | |
| 2012/0182695 A1 | 7/2012 | Mori et al. | |

FOREIGN PATENT DOCUMENTS

| | | |
|---|---|---|
| EP | 2003691 | 12/2008 |
| EP | 2141740 | 1/2010 |
| JP | 2009-065144 | 3/2009 |

OTHER PUBLICATIONS

Search report from E.P.O., mail date is Nov. 20, 2012.

* cited by examiner

COOLING DEVICE

BACKGROUND OF THE INVENTION

The present invention relates to a cooling device, for example for an electronic device.

In cooling devices for use, for example in an electronic device in vehicles such as a passenger vehicle or industrial vehicle, a metal substrate on which a semiconductor device is to be mounted, an insulation plate, a metal layer for stress relief, and a heat sink are laminated so as to improve heat radiating performance. Generally, the metal substrate, the insulation plate, the metal layer, the heat sink are bonded together by means such as soldering or brazing.

Japanese Unexamined Patent Application Publication No. 2009-65144 discloses an electronic device, or a power module having a circuit board on one surface of which a semiconductor chip is mounted and on the other surface of which a heat sink is bonded. The circuit board is composed of a nitride-based ceramic plate, a circuit layer formed by a single-layer aluminum and laminated on one surface of the ceramic plate, and a metal layer for heat radiation formed by a double-layer aluminum with different purities and laminated on the other surface of the ceramic plate.

Specifically, aluminum-silicon-based brazing metal foils are provided between the circuit layer and the ceramic plate and between the ceramic plate and the metal layer. The circuit board is manufactured in such a way that the circuit layer, the brazing metal foil, the ceramic plate, the brazing metal foil and the metal layer laminated in this order are heated in vacuum atmosphere while being pressed so that the brazing metal foils are melted. After the manufacturing of the circuit board, the semiconductor chip is bonded to the circuit layer by soldering, and the heat sink is bonded to the metal layer by soldering or brazing. The semiconductor module is thus manufactured.

There has been a known problem with solder bonding that deterioration of the solder due to the use in a temperature changing environment over the years results in reduced heat transfer performance. To prevent this, the circuit board disclosed in the publication No. 2009-65144 is manufactured by brazing using brazing metal foil.

In the electronic device disclosed in the publication No. 2009-65144, however, the heat sink need to be bonded to the circuit board by soldering using solder the melting point of which is lower than that of the brazing metal foil. This is because bonding of the circuit board and the heat sink by brazing results in melting of the brazing metals for bonding of the components of the circuit board thereby to cause misalignment or deformation of such components, which makes it difficult to form the circuit board in desired shape. Thus, the circuit board and the heat sink are bonded generally by soldering which can be done at a lower temperature than brazing.

As described above, in the conventional cooling device as disclosed in the publication No. 2009-65144, the heat sink need to be bonded to the circuit board by soldering after the manufacturing of the circuit board, resulting in inefficient manufacturing and a decrease of heat radiating performance due to the use over the years.

The present invention is directed to providing a cooling device that allows efficient manufacturing and prevents decrease of heat radiating performance.

SUMMARY OF THE INVENTION

In accordance with an aspect of the present invention, a cooling device includes a heat sink having a top plate, a bottom plate spaced from the top plate and fins between the top and bottom plates, a first metal member laminated to the side of the top plate that is opposite from the fins, and a first insulator laminated to the first metal member. The top plate, the bottom plate and the first metal member are each made of a clad metal that is composed of a base metal and a brazing metal, so that the fins are brazed to the top and bottom plates, the first metal member is brazed to the top plate, and the first insulator is brazed to the first metal member.

Other aspects and advantages of the invention will become apparent from the following description, taken in conjunction with the accompanying drawings, illustrating by way of example the principles of the invention.

DETAILED DESCRIPTION OF THE EMBODIMENTS

Figure 1:
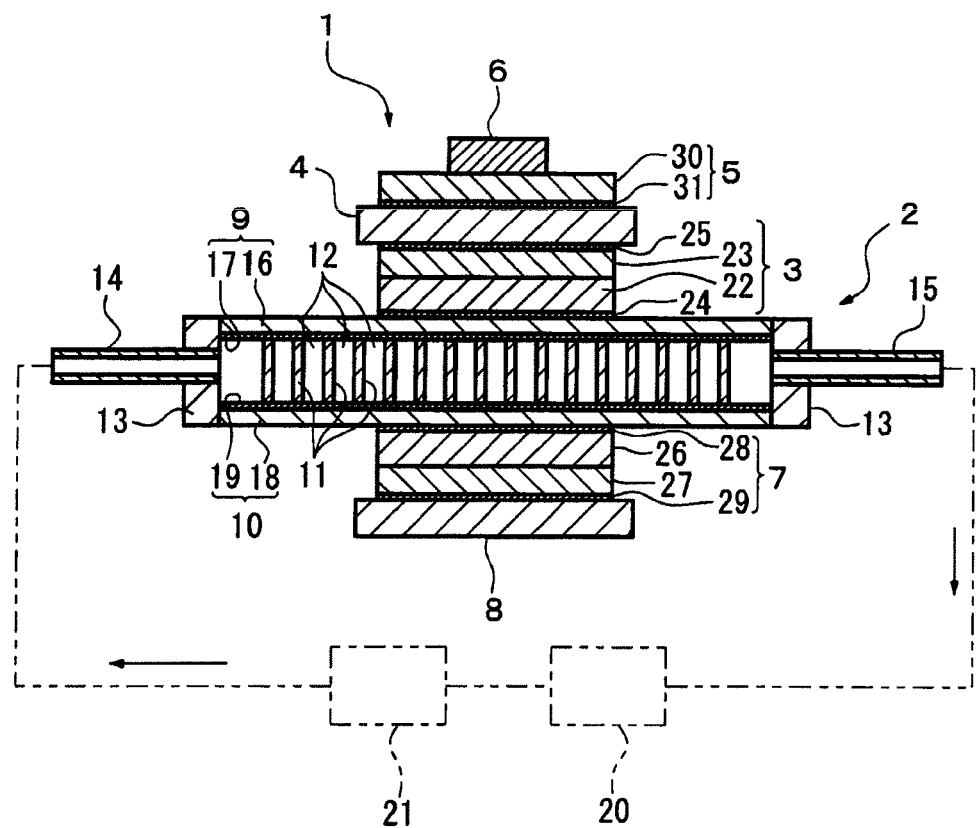
FIG. 1 is a longitudinal sectional view of a cooling device according to a first embodiment of the present invention.

The following will describe the embodiments of the cooling device according to the present invention with reference to the accompanying drawings. It is noted that the upper and lower sides as viewed in the drawings correspond to the upper and lower sides of the cooling device, respectively.

Referring to FIG. 1, the cooling device designated generally by 1 includes a heat sink 2, first and second metal members 3, 7, first and second insulators 4, 8, and a metal substrate 5. The first metal member 3, the first insulator 4 and the metal substrate 5 are laminated on the upper surface of the heat sink 2. The second metal member 7 and the second insulator 8 are laminated on the lower surface of the heat sink 2. A semiconductor device 6 as a heat generating component is mounted on the metal substrate 5.

The heat sink 2 has top and bottom plates 9, 10 spaced from each other, between which plural fins 11 are arranged at intervals. Any two adjacent fins 11 form therebetween a passage 12 where water as a refrigerant is flown. The heat sink 2 has side plates 13 provided around the periphery of the top and bottom plates 9, 10 and connected to a feed pipe 14 and a drain pipe 15, respectively. The top and bottom plates 9, 10, the side plates 13, the fins 11, and the feed and drain pipes 14, 15, which are the components of the heat sink 2, are made of a metal having high thermal conductivity such as an aluminum-based metal.

The top plate 9 of the heat sink 2 is made of a clad metal which is composed of a base metal 16 and an aluminum-silicon-based brazing metal 17. The brazing metal 17 is laminated to the side of the base metal 16 on the lower side thereof that is adjacent to the fins 11. The bottom plate 10 of the heat sink 2 is made of a clad metal which is composed of a base metal 18 and an aluminum-silicon-based brazing metal 19. The brazing metal 19 is laminated to the side of the base metal 18 on the upper side thereof that is adjacent to the fins 11. The fins 11 are bonded to the top and bottom plates 9, 10 by the brazing metals 17, 19. In the heat sink 2, water is introduced through the feed pipe 14 into the passages 12 where heat exchange occurs. Water heated after heat exchanging is delivered through the drain pipe 15 to the radiator 20 and cooled by heat radiation. Then the water is delivered back to the heat sink 2 by the pump 21 and introduced through the feed pipe 14 into the passages 12.

The first metal member 3 is made of two clad metals which are bonded together by brazing or any other suitable means. One clad metal is composed of a first base metal 22 formed, for example, by a perforated aluminum plate and an aluminum-silicon-based brazing metal 24 laminated to the lower surface of the first base metal 22. The other clad metal is composed of a second base metal 23 formed by an aluminum plate and an aluminum-silicon-based brazing metal 25 laminated to the upper surface of the second base metal 23.

As with the first metal member 3, the second metal member 7 is made of two clad metals which are bonded together by brazing or any other suitable means. One clad metal is composed of a first base metal 26 formed, for example, by a perforated aluminum plate and an aluminum-silicon-based brazing metal 28 laminated to the upper surface of the first base metal 26. The other clad metal is composed of a second base metal 27 formed by an aluminum plate and an aluminum-silicon-based brazing metal 29 laminated to the lower surface of the second base metal 27.

The first and second insulators 4, 8 are both made of nitride-based ceramics such as aluminum nitride (AlN) or silicon nitride ($Si_3N_4$), or oxide-based ceramics such as aluminum oxide ($Al_2O_3$) or zirconia ($ZrO_2$). The metal substrate 5 is made of a clad metal which is composed of a base metal 30 made of an aluminum and an aluminum-silicon-based brazing metal 31 laminated to the lower surface of the base metal 30. The semiconductor device 6 is mounted on the upper surface of the metal substrate 5 and electrically connected thereto, for example, by soldering or wire bonding, thus forming an electric circuit.

Manufacturing of the clad metals for the top and bottom plates 9, 10 of the heat sink 2, the first and second metal members 3, 7 and the metal substrate 5 is accomplished by any known method such as roll bonding, plating or printing. The brazing metals used in the present embodiment have substantially the same chemical composition. Different brazing metals having different chemical compositions may be used as long as the difference of the melting points of such brazing metals is small.

In manufacturing the cooling device 1, firstly, the second insulator 8, the second and first base metals 27, 26 of the second metal member 7, the bottom plate 10, the fins 11, the top plate 9, the first and second base metals 22, 23 of the first metal member 3, the first insulator 4 and the metal substrate 5 are stacked in this order on a workbench (not shown). Heating the stacked components to a predetermined temperature in vacuum atmosphere while pressing them in the direction of the stack, the brazing metals of the clad metals of the respective components are melted.

The first metal member 3 is brazed to the upper surface of the top plate 9 by the brazing metal 24 and to the lower surface of the first insulator 4 by the brazing metal 25. The metal substrate 5 is brazed to the upper surface of the first insulator 4 by the brazing metal 31. The second metal member 7 is brazed to the lower surface of the bottom plate 10 by the brazing metal 28 and to the upper surface of the second insulator 8 by the brazing metal 29. The fins 11 are brazed at the upper ends thereof to the lower surface of the top plate 9 by the brazing metal 17 and at the lower ends thereof to the upper surface of the bottom plate 10 by the brazing metal 19.

In this way, the components of the cooling device 1, namely, the heat sink 2, the first and second metal members 3, 7, the metal substrate 5, the first and second insulators 4, 8 can be brazed at one time, thereby allowing simple and efficient manufacturing of the cooling device 1. Further, bonding surfaces of the respective components other than the semiconductor device 6 are brazed, which prevents decrease of heat radiating performance of the cooling device 1 due to the use over the years, as compared to the case of solder bonding.

In manufacturing the heat sink 2, for example, the top plate 9, the bottom plate 10 and the fins 11 are brazed at one time as described above, and then the side plates 13, the feed pipe 14 and the drain pipe 15 are mounted by any suitable means. Alternatively, the top plate 9, the bottom plate 10, the fins 11, the side plates 13, the feed pipe 14 and the drain pipe 15 may be brazed at one time. The semiconductor device 6 is mounted on the metal substrate 5 which has already been brazed to the first insulator 4 as described above.

Figure 2:
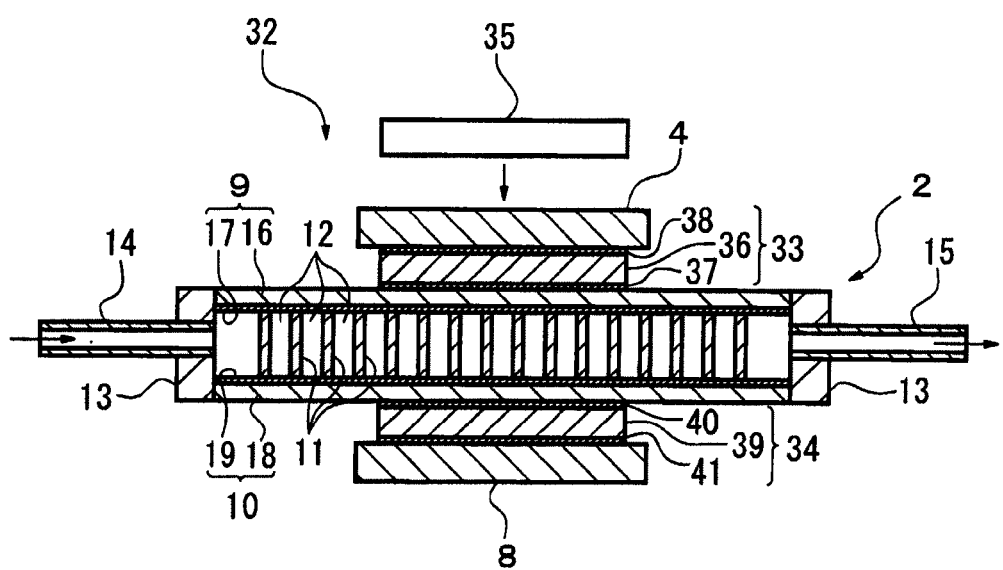
FIG. 2 is a longitudinal sectional view of a cooling device according to a second embodiment of the present invention.

FIG. 2 shows the second embodiment of the cooling device according to the present invention. The second embodiment differs from the first embodiment in the structure of the first and second metal members and also in that a semiconductor module 35 replaces the semiconductor device 6 on the first insulator 4. In the drawing, same reference numerals are used for the common elements or components in the first and second embodiments, and the description of such elements or components of the second embodiment will be omitted.

In the cooling device 32, the first metal member 33, the first insulator 4 and the semiconductor module 35 are laminated in this order on the upper surface of the top plate 9 of the heat sink 2. The second metal member 34 and the second insulator 8 are laminated in this order on the lower surface of the bottom plate 10 of the heat sink 2.

The first metal member 33 is made of a clad metal which is composed of a base metal 36 formed by an aluminum plate, an aluminum-silicon-based brazing metal 37 laminated to the lower surface of the base metal 36 and an aluminum-silicon-based brazing metal 38 laminated to the upper surface of the base metal 36. As with the first metal member 33, the second metal member 34 is made of a clad metal which is composed of a base metal 39 formed by an aluminum plate, an aluminum-silicon-based brazing metal 40 laminated to the upper surface of the base metal 39 and an aluminum-silicon-based brazing metal 41 laminated to the lower surface of the base metal 39. The semiconductor module 35 is of an insulated or non-insulated type having therein a circuit board and a semiconductor device mounted thereon.

In manufacturing the cooling device 32, the second insulator 8, the second metal member 34, the bottom plate 10, the fins 11, the top plate 9, the first metal member 33 and the first insulator 4 stacked in this order on a workbench are heated while being pressed as in the case of the first embodiment, so that the brazing metals of the respective clad metals are melted. The first metal member 33 is brazed to the upper surface of the top plate 9 by the brazing metal 37 and to the lower surface of the first insulator 4 by the brazing metal 38. The second metal member 34 is brazed to the lower surface of the bottom plate 10 by the brazing metal 40 and to the upper surface of the second insulator 8 by the brazing metal 41. The fins 11 are brazed at the upper ends thereof to the lower surface of the top plate 9 by the brazing metal 17 and at the lower ends thereof to the upper surface of the bottom plate 10 by the brazing metal 19, as in the case of the first embodiment.

According to the second embodiment, the top and bottom plates 9, 10 of the heat sink 2 and the first and second metal members 33, 34 each made of a clad metal composed of a base metal and a brazing metal can be brazed at one time, thus providing the advantages similar to those of the first embodiment. After the brazing of the components, the semiconductor module 35 can be easily mounted on the first insulator 4 by any suitable means such as a screw.

Figure 3:
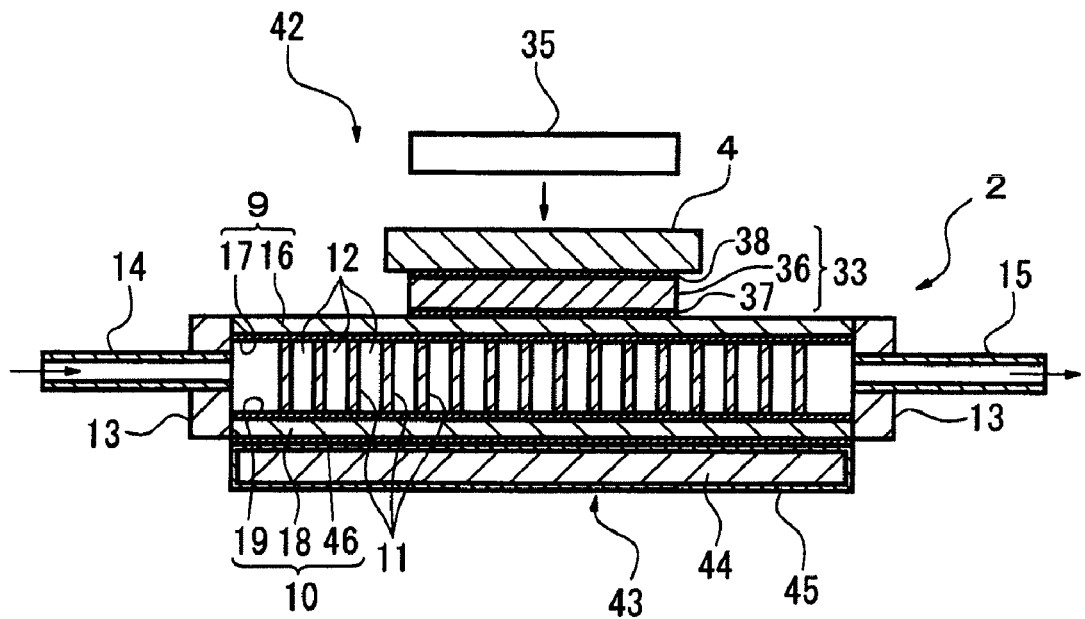
FIG. 3 is similar to FIG. 2, but showing a third embodiment of the cooling device.

FIG. 3 shows the third embodiment of the cooling device according to the present invention. The third embodiment differs from the second embodiment in that a metal plate 43 replaces the second metal member 34 and the second insulator 8. In the drawing, same reference numerals are used for the common elements or components in the second and third embodiments, and the description of such elements or components of the third embodiment will be omitted.

In the cooling device 42, the first metal member 33, the first insulator 4 and the semiconductor module 35 are laminated in this order on the upper surface of the top plate 9 of the heat sink 2. The metal plate 43 is laminated on the lower surface of the bottom plate 10 of the heat sink 2. The metal plate 43 is provided by an aluminum-coated steel plate, specifically by a steel plate 44 coated with a plating 45. The bottom plate 10 is made of a clad metal which is composed of the base metal 18, the aluminum-silicon-based brazing metal 19 laminated to the upper surface of the base metal 18 and an aluminum-silicon-based brazing metal 46 laminated to the lower surface of the base metal 18.

In manufacturing the cooling device 42, the metal plate 43, the bottom plate 10, the fins 11, the top plate 9, the first metal member 33 and the first insulator 4 stacked in this order on a workbench are heated while being pressed as in the case of the first and second embodiments, so that the brazing metals of the respective clad metals are melted. The first metal member 33 is brazed to the upper surface of the top plate 9 by the brazing metal 37 and to the lower surface of the first insulator 4 by the brazing metal 38. The metal plate 43 is brazed to the lower surface of the bottom plate 10 by the brazing metal 46. The fins 11 are brazed at the upper ends thereof to the lower surface of the top plate 9 by the brazing metal 17 and at the lower ends thereof to the upper surface of the bottom plate 10 by the brazing metal 19, as in the case of the second embodiment.

According to the third embodiment, the top and bottom plates 9, 10 of the heat sink 2 and the first metal member 33 each made of a clad metal composed of a base metal and a brazing metal can be brazed at one time together with the metal plate 43, thereby allowing simple and efficient manufacturing of the cooling device 42, as in the case of the first and second embodiments. Further, the provision of the metal plate 43 prevents flexure of the heat sink 2 and the other laminated components. Bonding by brazing prevents decrease of radiating performance of the cooling device 42 due to the use over the years.

The third embodiment may be modified so that the bottom plate 10 of the heat sink 2 is made of a clad metal which is made of the base metal 18 and the aluminum-silicon-based brazing metal 19 laminated to the upper surface of the base metal 18, and a brazing metal is laminated to the upper surface of the metal plate 43 to form a clad metal.

Figure 4:
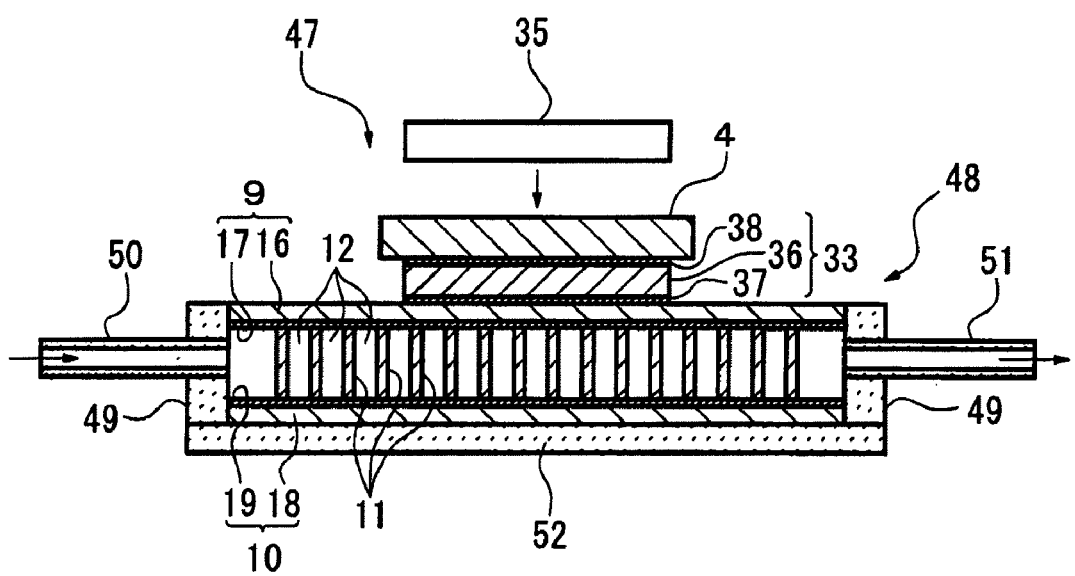
FIG. 4 is similar to FIG. 2, but showing a fourth embodiment of the cooling device.

FIG. 4 shows the fourth embodiment of the cooling device according to the present invention. The fourth embodiment differs from the second embodiment in the structure of the heat sink and in that the second metal member and the second insulator are removed. In the drawing, same reference numerals are used for the common elements or components in the second and fourth embodiments, and the description of such elements or components of the fourth embodiment will be omitted.

In the cooling device 47, the first metal member 33, the first insulator 4 and the semiconductor module 35 are laminated in this order on the upper surface of the top plate 9 of the heat sink 48. The heat sink 48 has the top and bottom plates 9, 10 spaced from each other, between which the fins 11 are arranged at intervals. Any two adjacent fins 11 form therebetween the passage 12 where refrigerant is flown. The top plate 9 is made of a clad metal which is composed of the base metal 16 such as aluminum and the brazing metal 17 laminated to the lower surface of the base metal 16. The bottom plate 10 is made of a clad metal which is made of the base metal 18 such as aluminum and the brazing metal 19 laminated to the upper surface of the base metal 18. The heat sink 48 has resin side plates 49 provided around the periphery of the top and bottom plates 9, 10 and connected to a resin feed pipe 50 and a resin drain pipe 51, respectively. A resin plate 52 is mounted to the lower surface of the bottom plate 10 of the heat sink 48.

Though illustrated in a simplified form in the drawing, the side plates 49, the feed pipe 50 and the drain pipe 51 forming part of the passages 12 of the heat sink 48 actually have complicated shapes and, therefore, it is difficult to form such components by metals. In the fourth embodiment, the top plate 9, the bottom plate 10 and the fins 11 made of a metal provide good heat radiation, while the use of a resin as the material for the side plates 49, the resin plate 52, the feed pipe 50 and the drain pipe 51 help to form such components into complicated shapes.

In the fourth embodiment, the resin plate 52 may be removed. In this case, the component or components to be laminated to the lower surface of the bottom plate 10 can be selected from the second metal member 7 and the second insulator 8 of the first embodiment, the second metal member 34 and the second insulator 8 of the second embodiment, or the metal plate 43 of the third embodiment. The fourth embodiment not only offers the advantages similar to those of the previous embodiments, but also makes it easy to form the heat sink.

The above embodiments may be modified in various ways as exemplified below.

(1) The clad metals for the first metal member 3 of the first embodiment may be modified so that brazing metals are laminated to both of the upper and lower surfaces of either one of the first and second base metals 22, 23 while a brazing metal is laminated to the surface of the other of the first and second base metals 22, 23 that is opposite from the first-mentioned base metal. Similarly, the clad metals for the second metal member 7 may be modified so that brazing metals are laminated to both of the upper and lower surfaces of either one of the first and second base metals 26, 27 while a brazing metal is laminated to the surface of the other of the first and second base metals 26, 27 that is opposite from the first-mentioned base metal.

(2) In the first embodiment, the first metal member 3 may be made of the first base metal 22 and a clad metal bonded to the first base metal 22 and composed of the second base metal 23 and the brazing metal 25 laminated to the upper surface of the second base metal 23, while the top plate 9 of the heat sink 2 may be made of a clad metal which is composed of the base metal 16 and brazing metals laminated to both of the upper and lower surfaces of the base metal 16. Similarly, the second metal member 7 may be made of the first base metal 26 and a clad metal bonded to the first base metal 26 and composed of the second base metal 27 and the brazing metal 29 laminated to the lower surface of the second base metal 27, while the bottom plate 10 of the heat sink 2 may be made of a clad metal which is composed of the base metal 18 and brazing metals laminated to both of the upper and lower surfaces of the base metal 18. A combination of the above cases is also possible.

(3) In the second embodiment, the first metal member 33 may be made of a clad metal which is composed of the base metal 36 and a brazing metal laminated to the upper surface of the base metal 36, while the top plate 9 of the heat sink 2 may be made of a clad metal which is composed of the base metal 16 and brazing metals laminated to both of the upper and lower surfaces of the base metal 16. Similarly, the second metal member 34 may be made of a clad metal which is composed of the base metal 39 and a brazing metal laminated to the lower surface of the base metal 39, while the bottom plate 10 of the heat sink 2 may be made of a clad metal which is composed of the base metal 18 and brazing metals laminated to both of the upper and lower surfaces of the base metal 18. A combination of the above cases is also possible.

(4) In the first and second embodiments, the second metal members 7, 34 and the second insulator 8 provided below the heat sink 2 may be removed.

(5) The heat sinks 2, 48 may be not only of water cooling type, but also of air cooling type.

(6) In the first and second embodiments, the base metals of the first metal members 3, 33, the second metal members 7, 34 and the metal substrate 5 which are made of aluminum may be made of any other metals having high thermal conductivity such as copper. In this case, suitable brazing metals such as copper or silver brazing metal may be selected and used.

(7) In the first embodiment, the semiconductor device 6 may be replaced by any other heat-generating components such as resistor or capacitor.

(8) The present invention is applicable not only to an electronic device for use in a vehicle, but also to an electronic device for consumers or other electronic devices of relatively small size.

What is claimed is:

1. A cooling device, comprising:
  a heat sink having a top plate, a bottom plate spaced from the top plate, and fins between the top and bottom plates;
  a first metal member laminated to the side of the top plate that is opposite from the fins; and
  a first insulator laminated to the first metal member,
  wherein the top plate, the bottom plate and the first metal member are each made of a clad metal that is composed of a base metal and a brazing metal, so that the fins are brazed to the top and bottom plates, the first metal member is brazed to the top plate, and the first insulator is brazed to the first metal member.

2. The cooling device according to claim 1, wherein the first metal member is composed of a base metal and brazing metals laminated to the opposite sides of the base metal, the top and bottom plates are each composed of a base metal and a brazing metal laminated to the side of the base metal that is adjacent to the fins.

3. The cooling device according to claim 1, further comprising a second metal member and a second insulator, wherein the second metal member is laminated to the side of the bottom plate that is opposite from the fins, the second metal member is made of a clad metal having substantially the same chemical composition as that of the clad metal for the first metal member, the second insulator is laminated to the second metal member, the second insulator is made of a clad metal having substantially the same chemical composition as that of the clad metal for the first insulator.

4. The cooling device according to claim 1, further comprising a metal substrate laminated to the first insulator, wherein the metal substrate is made of a clad metal that is composed of a base metal and a brazing metal laminated to the side of the base metal that is adjacent to the first insulator, a heat-generating component is mounted to the metal substrate.

5. The cooling device according to claim 1, further comprising an aluminum-coated steel plate laminated to the side of the bottom plate that is opposite from the fins, wherein the bottom plate is composed of a base metal and brazing metals laminated to the opposite sides of the base metal.

6. The cooling device according to claim 1, wherein a semiconductor module is mounted to the first insulator.

7. The cooling device according to claim 3, wherein a semiconductor module is mounted to the second insulator.

* * * * *